(12) United States Patent
Smeeton et al.

(10) Patent No.: US 8,334,157 B2
(45) Date of Patent: Dec. 18, 2012

(54) SEMICONDUCTOR DEVICE AND A METHOD OF MANUFACTURE THEREOF

(75) Inventors: Tim Michael Smeeton, Oxford (GB); Katherine Louise Smith, Oxford (GB); Mathieu Xavier Sénès, Oxford (GB); Stewart Edward Hooper, Kidlington (GB)

(73) Assignee: Sharp Kabushiki Kaisha, Osaka (JP)

( * ) Notice: Subject to any disclaimer, the term of this patent is extended or adjusted under 35 U.S.C. 154(b) by 968 days.

(21) Appl. No.: 12/189,972

(22) Filed: Aug. 12, 2008

(65) Prior Publication Data

US 2009/0045394 A1 Feb. 19, 2009

(30) Foreign Application Priority Data

Aug. 16, 2007 (GB) .................. 0715993.2

(51) Int. Cl.
*H01L 21/00* (2006.01)
*H01L 29/06* (2006.01)
(52) U.S. Cl. ......... 438/47; 438/94; 257/13; 257/E21.09; 257/E31.033
(58) Field of Classification Search ............ 257/13; 438/94, 47, 503
See application file for complete search history.

(56) References Cited

U.S. PATENT DOCUMENTS

| | | | |
|---|---|---|---|
| 5,075,742 | A | 12/1991 | Gerard et al. |
| 5,532,510 | A | 7/1996 | Amorai-Moriya et al. |
| 5,614,435 | A | 3/1997 | Petroff et al. |
| 5,952,680 | A | 9/1999 | Strite |
| 6,445,009 | B1 | 9/2002 | Grandjean et al. |
| 6,507,042 | B1 | 1/2003 | Mukai et al. |
| 6,583,436 | B2 | 6/2003 | Petroff et al. |
| 6,681,064 | B2 | 1/2004 | Naniwae |
| 2002/0041148 | A1 | 4/2002 | Cho et al. |
| 2003/0047742 | A1 | 3/2003 | Hen |
| 2005/0067627 | A1 | 3/2005 | Shen et al. |
| 2005/0161683 | A1 | 7/2005 | Hahm et al. |
| 2006/0027820 | A1 | 2/2006 | Cao |

FOREIGN PATENT DOCUMENTS

| | | |
|---|---|---|
| JP | 63-213384 | 9/1988 |
| JP | 2003-309322 | 10/2003 |
| JP | 2004-207610 A | 7/2004 |
| WO | 02/09188 | 1/2002 |

OTHER PUBLICATIONS

P. Gibart; "Metal organic vapor phase epitaxy of GaN and lateral overgrowth"; Rep. Prog. Phys. 67, p. 667-715; 2004. (Previously identified on IDS filed on Aug. 12, 2008).

(Continued)

*Primary Examiner* — Lex Malsawma
(74) *Attorney, Agent, or Firm* — Renner, Otto, Boisselle & Sklar, LLP

(57) ABSTRACT

A method of manufacturing a semiconductor device comprises depositing a semiconductor layer over a semiconductor surface having at least one first region with a first (average surface lattice) parameter value and at least one second region having a second parameter value different from the first. The semiconductor layer is deposited to a thickness so self-organized islands form over both the first and second regions. The difference in the parameter value means the islands over the first region have a first average parameter value and the islands over the second region have a second average parameter value different from the first. A capping layer is deposited over islands and has a greater forbidden bandgap than the islands whereby the islands form quantum dots, which have different properties over the first and second regions due to difference(s) between the first and second region islands.

30 Claims, 7 Drawing Sheets

OTHER PUBLICATIONS

S. Mokkapati et al.; "Controlling the properties of InGaAs quantum dots by selective-area epitaxy"; Applied Physics Letters 86 113102; 2005.

B. Damilano et al.; "From visible to white light emission by GaN quantum dots on Si(111) substrate"; Applied Physics Letters 75 962; 1999.

British Search Report for corresponding UK Application No. GB0715993.2 dated Nov. 19, 2007.

P. Gibart; "Metal organic vapor phase epitaxy of GaN and lateral overgrowth"; Rep. Prog. Phys. 67 667; 2004.

D. Schuh et al.; "Long-range ordered self-assembled InAs quantum dots on (110) GaAs grown with molecular beam epitaxy"; $4^{th}$ IEEE Conference on Nanotechnology; 2004; pp. 189-191.

SEMICONDUCTOR DEVICE AND A METHOD OF MANUFACTURE THEREOF

This nonprovisional application claims priority under 35 U.S.C. §119(a) on Patent Application No. 0715993.2 filed in United Kingdom on 16 Aug. 2007, the entire contents of which are hereby incorporated by reference.

FIELD OF THE INVENTION

The present invention relates to a semiconductor device containing quantum dots, and in particular to an optoelectronic semiconductor device containing quantum dots, and to a method of manufacturing the same. The invention may be applied to, for example, light-emitting diodes (LEDs) or semiconductor laser diodes.

BACKGROUND OF THE INVENTION

Semiconductor optoelectronic devices such as light-emitting diodes (LEDs) and laser diodes (LDs) have a wide range of applications including use as indicator light components, as solid-state light sources and in optical storage systems. The suitability of a device for an application depends on the wavelength of the light generated by the device.

The wavelength of light emitted from an optoelectronic device depends on the properties of the light-emitting region of the device, which is described hereafter as the "active region" of the device. Semiconductor light-emitting devices are typically fabricated using an epitaxial deposition technique such as molecular beam epitaxy (MBE) or metalorganic vapor phase epitaxy (MOVPE). In these epitaxial deposition techniques the layers of the device are deposited sequentially onto a substrate and this substrate is subsequently divided into individual chips each containing an optoelectronic device. A feature of these epitaxial deposition techniques is that there is usually little or no control of the properties of each deposited layer as a function of position in the plane of the substrate surface on a length scale comparable with the final size of the chips. Therefore, each chip has an active region that has essentially the same properties over its entire surface area. As a consequence of this, each device (chip) emits light with a single wavelength, or sometimes with a small continuous range of wavelengths distributed about a wavelength at which the output intensity has a maximum value. This type of device is not optimum for the many applications for semiconductor optoelectronic devices which require mixing of light with more than one wavelength. For example, to generate light emission which is perceived as white light requires mixing of light with at least two wavelengths. Therefore, there is a demand to fabricate optoelectronic device chips which emit light at more than one emission wavelength, and which are referred to hereafter as "polychromatic" light-emitting devices.

One approach to fabricating polychromatic light-emitting devices is to combine two or more discrete chips, with different emission wavelengths from one another, together in a single package. However, there are significant disadvantages associated with this multiple-chip approach. The need to combine more than one chip in the package causes the minimum achievable package size to be larger than is possible for a single-chip package. Furthermore, since the different wavelengths of light are emitted from separate locations, complex, expensive and bulky packaging can be required to ensure that there is effective mixing of the component wavelengths. Therefore, multiple-chip packages have disadvantages for applications requiring low-cost and compact light sources.

These disadvantages can be overcome by the use of monolithic polychromatic light emitters, where multiple-wavelength emission is delivered from a single chip. This type of device can be fabricated if active regions with different emission wavelengths are positioned close to one-another on a substrate such that, when the substrate is divided into discrete chips, each chip contains active regions with the different emission wavelengths.

Approaches exist in the prior art to deliver monolithic polychromatic light emitters using epitaxial deposition techniques. One approach is to vertically stack, along the deposition direction, two or more light-emitting device structures, each with a different emission wavelength. For example, a device formed from a light-emitting device fabricated from a II-VI semiconductor material deposited on top of a light-emitting device fabricated from a III-V semiconductor material is described in U.S. patent application No. 2002/0041148. Devices based around a similar vertical-stacking paradigm are also disclosed in U.S. patent application Nos. 2005/0067627 and 2006/0027820. The use of wafer bonding techniques to vertically join two light emitting devices which were deposited independently on different substrates is disclosed in U.S. patent application No. 2003/0047742. Disadvantages of these vertical stacking approaches include the complexity and high costs of vertically stacking devices with different emission wavelengths, the significant complexity of device processing which is required to enable independent control of the current injected into the devices with different emission wavelengths during operation, and the necessity to grow each active region with an independent emission wavelength individually.

A second approach to fabricating monolithic polychromatic emitters is to position active regions having different emission wavelengths laterally in the plane of the substrate. U.S. patent application No. 2005/0161683 describes growth of a first light emitting device on a substrate, the subsequent removal of this device from regions of the wafer by etching, and re-growth of a second device with a different emission wavelength in these etched regions. The resultant device therefore contains two independent light emitting devices positioned side-by-side on the original substrate. A similar result is achieved according to U.S. Pat. No. 6,681,064 by applying multiple epitaxial deposition steps in defined regions of a substrate to grow multiple light emitting devices on a single substrate. A significant disadvantage of these approaches is that although only one substrate is used, epitaxial growth of an entire device structure is required for each individual emission wavelength.

One well-known type of active region for light emitting devices contains quantum dots. A quantum dot is a potential box in which either electrons or holes, or both electrons and holes (hereafter electrons and holes are referred to collectively as "carriers") are confined and experience significant quantum size effects in all three spatial dimensions owing to the small size of the box. A consequence of the three-dimensional quantum confinement is that the energy levels of the carriers are quantized into discrete levels and the density of states for carriers takes the form of one or more delta-functions.

In a semiconductor light-emitting device the active region of which contains quantum dots, the quantum dots are crystalline inclusions of a first semiconductor which are embedded in a matrix of a second semiconductor which has a wider forbidden energy band gap than the first semiconductor. The inclusions are sufficiently small in all three dimensions that carriers experience significant quantum size effects. The properties of quantum dots are strongly dependent on their size, composition and shape. Of particular relevance for active regions of light emitting devices containing quantum dots is that the wavelength of light emitted from the quantum dots can be strongly dependent on the size, composition and shape of the quantum dots.

A common method of preparing quantum dots for use in the active region of a light-emitting device is to exploit the self-organised formation of islands on a substrate surface during epitaxial deposition, such as by MBE or MOVPE techniques. Quantum dots suitable for active regions are formed when a capping layer is grown on top of the islands such that the island material becomes embedded between the capping material and the substrate.

When the forbidden energy band gap of the island material is smaller than that of the capping material and that of the material at the surface of the substrate on which the islands formed, the island material behaves as a potential box. Provided the dimensions of this box are small enough in all three spatial dimensions, the box will behave as a quantum dot. The formation of quantum dot active regions from self-organised island growth is widely reported in the art.

One driving force for the self-organised formation of islands during epitaxial growth can be the strain caused by there being a difference between lattice parameters that a deposited material would adopt when it is elastically relaxed and the equivalent lattice parameters in the substrate near to the growth surface which the deposited material adopts during epitaxial growth (the relevant lattice parameters are those lying in the plane parallel to the growth surface of the substrate). When there is such a lattice parameter mismatch between the deposited material and the substrate or underlayer over which it is deposited, a commonly observed behavior is that the deposited material initially forms a flat layer which covers the entire surface (this is referred to as two-dimensional (2D) growth) and then, as the deposition proceeds further, islands nucleate on the surface of the layer and the subsequently deposited material is accommodated into these islands, rather than into the flat layer (this is referred to as three-dimensional (3D) growth). The epitaxial growth of a layer which initially occurs in the 2D mode and then proceeds in the 3D island-growth mode is commonly referred to as Stranski-Krastanow growth, and will be referred to as SK growth hereafter. The flat layer which forms during the 2D growth stage is commonly referred to as a wetting layer. The thickness of the wetting layer at which the transition from 2D growth to 3D growth takes place is commonly referred to as the critical thickness of the wetting layer. The formation of islands by SK growth has been reported for a wide range of materials systems in the prior art.

The driving force for the transition from 2D growth to 3D growth depends on the mismatch between the lattice parameter of the deposited material and the lattice parameter of the substrate surface. The detailed properties of SK growth and the transition from 2D growth to 3D growth depend on the epitaxial deposition conditions and on the materials involved. However it is generally reported in the prior art for a wide range of materials systems that the critical thickness decreases as the lattice parameter mismatch between the underlayer and the deposited material increases.

The influence of the lattice parameter mismatch between the deposited material and the underlayer on the transition from 2D growth to 3D growth may be used to control the regions on a substrate within which islands are nucleated during SK growth. This effect is exploited in U.S. Pat. No. 5,614,435 in a method which results in preferred nucleation of islands only in pre-determined regions of the substrate. A suggested method for achieving this preferred nucleation is for the SK growth to take place on a substrate where the surface strain of the substrate varies between the regions where island formation is desired and the regions where no island formation is desired. This difference in surface strain means that there is a difference in the lattice parameter mismatch between the deposited material and the substrate surface in the two types of region. The difference in mismatch results in different critical thicknesses between the regions where island formation is desired and the regions where no island formation is desired during SK growth, and the substrate surface strains are chosen so that the critical thickness is larger in the regions where no islands are desired. Provided that the amount of material which is deposited during the SK growth exceeds the smaller critical thickness and does not exceed the larger critical thickness, islands are only formed in the desired regions. U.S. Pat. No. 6,583,436 describes similar control over the regions at which islands will be nucleated according to modulations in the surface strain of the substrate used for the SK layer growth.

A method which demonstrates the importance of the substrate surface lattice parameter in determining the properties of islands formed during SK growth is described in U.S. Pat. No. 6,507,042. It is described that the emission wavelength from light-emitting devices with quantum dot active regions formed using SK growth can be adjusted by selection of the surface lattice parameter of the substrate or buffer layer on which the SK growth is carried out. This selection of the surface lattice parameter of the substrate or buffer layer is achieved by selection of an appropriate composition for said substrate or buffer layer. Through selection of substrates with larger lattice parameters, active regions containing $In_xGa_{1-x}As$ quantum dots with emission wavelengths at longer wavelengths were formed. Although this substrate surface lattice parameter selection approach delivers a way of adjusting the emission wavelength from devices grown in separate epitaxial deposition layers, there is no facility to deliver control of quantum dot properties within a single layer.

An existing approach in the prior art which can deliver this desirable in-plane control of the properties of quantum dots formed from SK island growth is described by S. Mokkapati et al. in "Controlling the properties of InGaAs quantum dots by selective-area epitaxy", Applied Physics Letters 86 113102 (2005). This method is commonly referred to as selective-area epitaxy. In this approach the substrate surface which is to be used for SK growth is patterned with masked regions. During the subsequent SK growth, the deposited material does not adhere to the masked regions and may migrate across the mask to the regions of the substrate surface which are not masked. A consequence of this migration from the masks is that the total amount of material which arrives in the regions between masks can depend on the size of the masked regions and the size of the regions in between the masks. Therefore, by use of different mask patterns in different regions of a substrate, the islands formed during SK growth can have different properties in different regions of the substrate. One significant disadvantage of the selective-area epitaxy method is that it relies on direct epitaxial growth onto the masked surface and therefore residual contamination at the surface caused during the fabrication of the mask can degrade the properties of the resulting quantum dots. A further significant limitation of the method is that a mask is deposited on the substrate surface each time a new SK growth is to be carried out and therefore the method is poorly suited to preparation of quantum dot active regions for light emitting devices where more than one layer of SK growth is often performed within each device structure so that the emission intensity from the device can be high.

JP-A-2003 309322 discloses preparing a substrate having a bulk InP layer over which are provided alternating regions of InP and GaInAsP. InAs quantum dots are then grown over the substrate.

Other related prior art includes U.S. Pat. Nos. 5,075,742, 5,952,680 and 6,445,009, and B. Damilano et al. "From visible to white light emission by GaN quantum dots on Si(111) substrate" Appl. Phys. Lett. 75 962 (1999).

SUMMARY OF THE INVENTION

A first aspect of the present invention provides a method of manufacturing a semiconductor device, the method comprising the steps of: treating a semiconductor surface to obtain at least one first region of the surface having a first value of average surface lattice parameter and at least one second region of the surface having a second value of average surface lattice parameter different from the first value; depositing a second semiconductor layer over the semiconductor surface to a thickness such that self-organised islands form over both the at least one first region and the at least one second region, the self-organised islands over the or each first region having a first average value of a parameter and the self-organised islands over the or each second region having a second average value of a parameter different from the first value; and depositing a capping layer thereby to form a plurality of quantum dots over the or each first region and a plurality of quantum dots over the or each second region, the quantum dots over the or each first region having different properties from the quantum dots over the or each second region.

It should be noted that the feature "treating a semiconductor surface" does not require that all regions of the surface are treated. For example, only the first (or second) regions of the surface may be treated to change their average surface lattice parameter (ASLP), with the second (or first) regions being untreated. Alternatively, both the first and second regions of the surface may be treated so that the first and second regions both have an ASLP that is different to the initial ALSP of the surface (with the first and second regions having a different ASLP from one another).

The semiconductor device may be a semiconductor light-emitting device and the quantum dots over the first region may have different optical properties from the quantum dots over the second region.

Alternatively the semiconductor device may be a light-sensitive semiconductor device, such as a photodiode, and the quantum dots over the first region may have different light-absorbing properties from the quantum dots over the second region.

Alternatively the semiconductor device may be a memory device in which carriers are stored in quantum dots, and the quantum dots over the first region may have different carrier storing properties from the quantum dots over the second region.

A second aspect of the invention provides a semiconductor device manufactured by a method of the first aspect and having an active region, a first part of the active region containing a plurality of first quantum dots and a second part of the active region containing a plurality of second quantum dots, the first quantum dots having different properties from the second quantum dots.

Other features of the invention are set out in the dependent claims.

The present invention thus provides a monolithic semiconductor device which contains quantum dots which have different properties in different pre-defined regions of the device, and a method for fabricating the same. According to the present invention the quantum dots are formed by self-organised island formation during epitaxial deposition. The invention provides for the self-organised growth of islands with different properties in different regions of the substrate during a single epitaxial deposition process.

Additional objects, features, and strengths of the present invention will be made clear by the description below. Further, the advantages of the present invention will be evident from the following explanation in reference to the drawings.

BRIEF DESCRIPTION OF THE DRAWINGS

Preferred embodiments of the present invention will now be described by way of illustrative example with reference to the accompany figures, in which:

FIG. 6a shows a plan view of a substrate, according to another embodiment of the present invention;

FIG. 6b is a plan view of a discrete chip cut from the substrate shown in FIG. 6a;

FIG. 6c is a plan view of a discrete chip cut from the substrate shown in FIG. 6a;

FIG. 9a is a schematic sectional view of a device according to another embodiment of the invention; and FIG. 9b is a schematic exploded sectional view of the embodiment of FIG. 9a.

DESCRIPTION OF THE EMBODIMENTS

Figure 1:
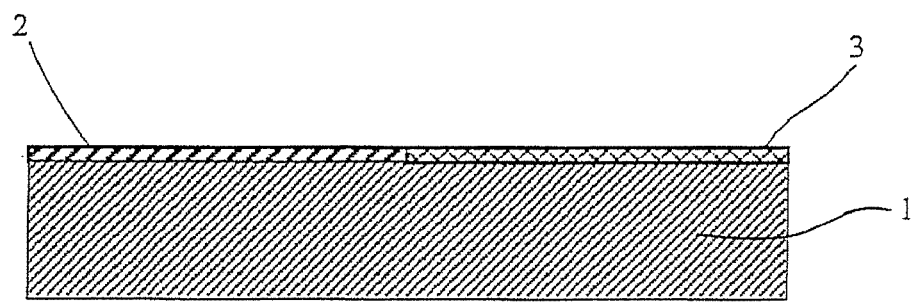
FIGS. 1a-1c are cross-sectional views showing steps in the formation of quantum dots with different properties in different pre-defined regions over a substrate.
Figure 1:
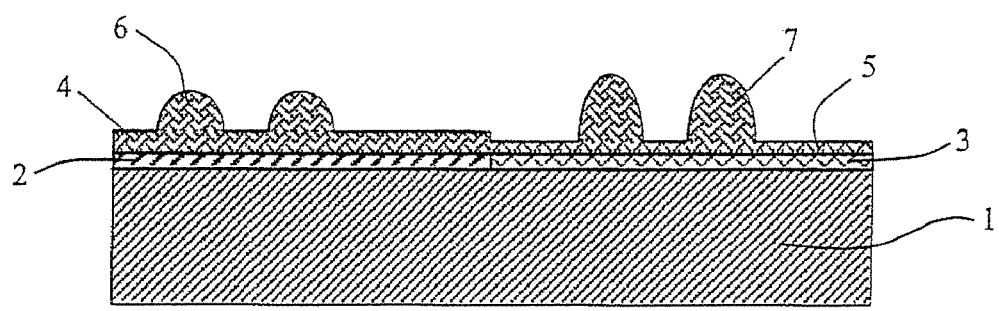
Figure 1:
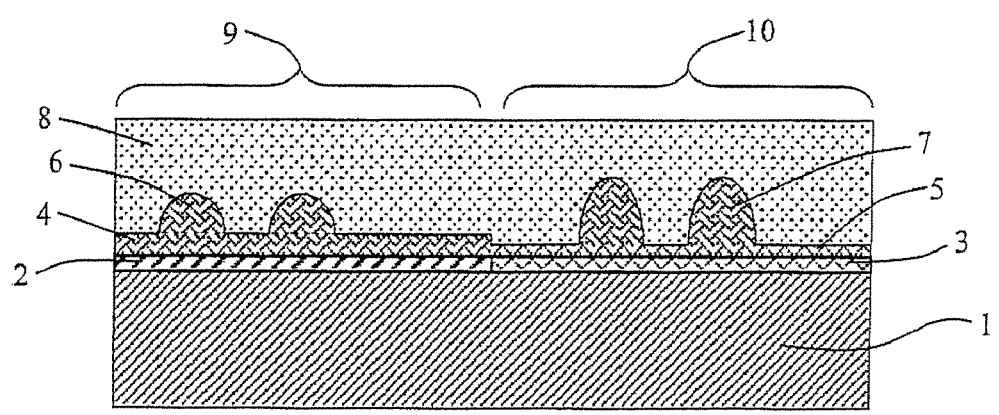

The principal steps of a method to achieve self-organised formation of islands with different properties during a single epitaxial deposition process will be explained with reference to FIGS. 1a to 1c, which are schematic cross-sectional views showing steps of the method. FIG. 1a is a cross-section showing a substrate 1, for example a semiconductor substrate, on which the deposition is made. The surface of this substrate is prepared so that it contains a desired distribution of two pre-determined types of region 2 and 3 (only one region of each type is shown in FIG. 1a for convenience). The average surface lattice parameter (referred to as ASLP hereafter) within regions 2 is larger than the ASLP in regions 3. The surface lattice parameters of the substrate are the lattice parameters measured in a plane parallel to the growth surface of the substrate at or near the surface of the substrate which are the lattice parameters adopted by material grown epitaxially onto the growth surface. The ASLP is the average of the surface lattice parameters along all principal crystallographic axes which lie in the plane of the surface. The ASLP can be determined using many analytical techniques including high-resolution X-ray diffraction, reflection high energy electron diffraction and scanning tunneling microscopy.

The substrate surface having two pre-determined types of region 2,3 of different ASLP is obtained by treating a surface. The surface may initially have an ASLP that corresponds to the ASLP desired for one type of the region, for example region 2. In this case, the substrate surface may be obtained by treating only regions 3 to obtain a different ASLP in regions 3 (with regions 2 being untreated and retaining the ALSP of the initial surface). Alternatively, the substrate surface may be obtained by treating both regions 2 and regions 3 so that regions 2 and regions 3 both have an ASLP that is different to the ALSP of the initial surface (with the regions 2 having an ASLP that is different to the ALSP of regions 3).

Where the substrate surface is obtained by treating both regions 2 and regions 3 so that regions 2 and regions 3 both have an ASLP that is different to the ALSP of the initial surface, regions 2 and regions 3 may be treated at the same time in one processing step or regions 2 and regions 3 may be treated in separate processing steps.

Although FIGS. 1a to 1c show only two types of regions, the invention is not limited to this and the surface may contain more than two types of regions.

Material is deposited onto the surface of the substrate 1 using an epitaxial deposition technique such as MBE or MOVPE such that the deposited material undergoes SK growth on the substrate surface and self-organised islands form. As is known from the prior art, the final properties of self-organised islands formed during SK growth can be adjusted through use of a growth interrupt step immediately after growth. It is explicitly considered here to be within the scope of the invention that the self-organised islands may be formed using such an interrupt and that alternatively the self-organised islands may be formed without use of such an interrupt. Self-organised islands may be referred to as just 'islands', for brevity.

The critical thickness for SK island formation is different for the two types of regions 2 and 3 of the surface because the difference in ASLP between regions 2 and regions 3 means that the mismatch between the lattice parameter of the deposited material and the lattice parameter of the substrate surface is different between the two types of region. For the purpose of this explanation, it will be assumed that the critical thickness for SK island formation on regions 2 is larger than the critical thickness for SK island formation on regions 3.

The material for the SK layer is deposited uniformly over the upper surface of the substrate 1 so that the equivalent 2D thickness (referred to as E2DT hereafter) of the deposited material is the same in regions 2 as in regions 3. The E2DT is defined as the thickness of the layer which would form on the substrate if the deposited material was entirely accommodated into a layer with uniform thickness. The E2DT of the deposited material exceeds the critical thickness in all regions 2 and 3 and therefore islands form in all regions. (The term "upper" as used herein refers to the substrate when oriented as shown in FIG. 1a.)

A cross-sectional schematic diagram showing the structure after the self-organised formation of the islands is shown in FIG. 1b. Owing to the differences in SK critical thickness between regions 2 and 3, the final thickness of the wetting layer 4 in regions 2 is larger than the final thickness of the wetting layer 5 in regions 3. Since the E2DT which is deposited in regions 2 and 3 is the same, the volume of material which is incorporated into the islands in regions 3 is larger than the volume incorporated into the islands in regions 2. Therefore, the average properties of islands in regions 2 are different from the average properties of islands in regions 3. For example, one or any combination of the following properties can be different between islands in regions 2 and islands in regions 3: average height (measured along the growth direction, perpendicular to the substrate (i.e., parallel to the plane of the substrate surface)); average lateral dimensions (e.g., average width) (measured perpendicular to the growth direction); and average shape. Moreover, for self-organised islands which contain two or more chemical elements (e.g., a semiconductive alloy such as $A_xB_{1-x}$, where A and B represent different chemical elements), the average composition of islands formed in regions 2 can differ from the average composition of islands formed in regions 3 because the incorporation of elements in the wetting layer and islands can vary with the height, diameter and shape of the islands during their growth.

Additionally, the distribution of any of these island properties about their average value can be different for the ensemble of islands in regions 2 than for the ensemble of islands in regions 3.

Alternatively, or in addition to any of these differences in the properties of the individual islands or the island ensemble, the density of islands (defined as the number of islands per unit area of the substrate growth surface) in regions 2 can be different from the density of islands in regions 3. FIG. 1b shows an example where the average height of islands 6 formed in region 2 is smaller than the average height of islands 7 formed in region 2. (As is well known from the prior art, islands formed by self-organization during SK growth are usually not all identical and instead there is often some dispersion in the properties of the islands, such as a dispersion in their size about an average size. The islands indicated by 6 and 7 in FIG. 1b are a schematic representation of the average properties of the ensemble of islands formed in the regions 2 and 3.)

The self-organised islands 6, 7 and wetting layer 4, 5 are subsequently overgrown with a capping layer 8, as illustrated in FIG. 1c. The capping layer has a forbidden bandgap that is greater than the forbidden bandgap of the self-organised islands 6, 7, so that the self-organised islands 6, 7 form quantum dots.

Owing to the different structural properties of the islands 6 and 7 formed in the different types of region 2 and 3, the quantum dot active regions formed in the two types of region 2, 3 will exhibit different properties from one another. For example, since the wavelength of light emitted from quantum dots is sensitive to the quantum dot size, the emission wavelength from the quantum dots in regions 2 and 3 can be different. By this method, therefore, quantum dot active regions with different properties are fabricated monolithically in laterally distinct and pre-defined locations over a substrate, in a single epitaxial growth deposition. By choosing the size of the islands 6,7 appropriately, any desired emission wavelength may be selected for the quantum dots formed by the self-organised islands 6 and the quantum dots formed by the self-organised islands 7—and hence a desired overall spectral output may be obtained.

Any combination of size and shape for the regions of types 2 and 3 can be selected as desired, and the distribution of these regions over the substrate surface can be selected as desired. For example, regions of type 2 and 3 can be distributed over the substrate surface so that when the substrate is subsequently divided to yield individual chips, each chip contains a desired distribution of the two active regions.

Optionally, deposition of one or more further SK layers can be repeated over the capping layer 8 to form a vertical stack of quantum dot layers. In the case that after growth of the capping layer 8 the ASLP of the surface regions 9 and 10 of the capping layer are substantially similar to the ASLP of the original surface in the respective regions 2 and 3, these subsequent SK layers can demonstrate similar differences in self-organised island properties between the individual regions.

Although FIGS. 1a to 1c show only regions of two different types, leading to quantum dots of two different emission wavelengths, the invention is not limited to this and the method is applicable to a surface containing more than two types of region. In the general case, the substrate surface is prepared to contain any desired distribution of any desired number of types of region where each type of region is distinct from the other types in that it has a different ASLP. For example, regions of three different types may be provided, leading to quantum dots of three different emission wavelengths.

This method for fabricating active regions which have different properties in different pre-defined and laterally distinct regions of the substrate has significant advantages over methods in the prior art which achieve a similar result. As set out in the discussion of prior art above, the two existing methods in the prior art which achieve a similar result either rely on selective area epitaxial growth of quantum dots or on consecutive growth of different active regions onto different regions of the substrate. The consecutive growth approach requires at least one separate epitaxial deposition process for each distinct active region. With the present method, however, any desired number of different active region properties can be incorporated onto a substrate using a single epitaxial deposition process. The need for only a single epitaxial deposition process offers significant reductions in cost and the flexibility to feasibly fabricate structures with a large number of distinct active regions. A significant advantage of the present method over selective area epitaxy is that with the present method it is not necessary to deposit the SK layer directly onto a masked surface and therefore disadvantages associated with the deterioration of the properties of the quantum dot active region owing to residual contamination of the surface during the masking process are avoided. Another significant advantage of the present method over selective area epitaxy is that the control over the properties of the quantum dots can be maintained through a stack of multiple layers of quantum dots without the need to fabricate an individual mask for each layer. This enables the fabrication of active regions containing multilayer stacks of quantum dots, which can be required for high-performance devices.

Although the methods described in U.S. Pat. Nos. 5,614,435 and 6,583,436 deliver some control over the nucleation of islands during SK growth, a significant limitation in both methods is that they do not provide any degree of control over the properties of the islands formed in different regions of the substrate.

A further feature of the present invention is that the surface containing the two (or more) types of regions 2,3 is obtained by treating a semiconductor surface to obtain the two (or more) types of regions. This means that layers subsequently grown over the surface will have a low density of defects.

In contrast, in the method of JP-A-2003 309322 the surface comprises alternating regions of InP and GaInAsP over an InP substrate. The growth of GaInAsP over regions of the InP substrate will result in defects (in particular dislocations) in the GaInAsP owing to mismatch of the lattice parameter of GaInAsP with the lattice parameter of InP. Furthermore, for materials which are difficult to wet-etch (such as the III-nitride materials), it is difficult to prepare an etched surface on which high-quality material can be grown. This is a further source of defects in the re-grown GaInAsP regions of JP-A-2003 309322.

The defects that occur, by either of the mechanisms described above, can significantly degrade the performance of quantum dots subsequently grown over the surface in JP-A-2003 309322. This problem is not present in the methods of the present invention since treating a semiconductor surface to obtain the two (or more) types of regions means that layers subsequently grown over the surface will have a low density of defects leading to high-quality layers.

A further advantage of the invention is that, compared to the method of JP-A-2003 309322, fewer epitaxial steps are required to obtain the surface.

Preferred embodiments of the invention will be described with reference to a light-emitting device that can emit light containing two or more different wavelength components. The invention is not however limited to light-emitting devices.

A light emitting device and a method for fabricating the same according to a first embodiment of this invention will be explained with reference to FIG. 2a-2d.

In this embodiment, a heterostructure with an elastically strained surface layer is deposited over a substrate using MBE. The heterostructure is shown in schematic cross-section in FIG. 2a. In this embodiment the substrate 12 is a template substrate consisting of a n-type doped GaN layer 13 grown over a sapphire base substrate 14. An n-type GaN buffer layer 15 and n-type $Al_xGa_{1-x}N$ ($0<x\leq1$) (hereafter referred to as AlGaN) layer 16 are grown, in this order, over the substrate 12. The ASLP of the AlGaN layer 16 is not equal to the ASLP in an elastically relaxed AlGaN crystal because the AlGaN layer is either partially or fully strained to the GaN buffer layer 15 in the plane parallel to substrate surface, and because the ASLP of relaxed AlGaN is not equal to the ASLP of the GaN buffer layer (which may be different from the ASLP of bulk GaN since a GaN layer grown on sapphire is not always fully relaxed to the parameters of bulk GaN). This requires that the thickness of the AlGaN layer is below the thickness at which full relaxation would occur so that the strain in the AlGaN layer is not fully relaxed (either through plastic relaxation or cracking). The AlGaN layer could be partially relaxed, although it is preferred that little or no relaxation of strain in the AlGaN layer occurs. Therefore the AlGaN layer 16 is an elastically strained surface layer.

The heterostructure is removed from the MBE deposition equipment and strain-relieving features are provided in/on the AlGaN layer 16 to cause controlled relaxation of the elastic strain in the AlGaN layer 16. In this embodiment the strain-relieving features are recesses, such as pits or trenches, formed (for example etched) into the AlGaN layer 16. (These recesses will hereinbelow be referred to as "pits" for clarity). When the pits are etched into the AlGaN layer 16, free surfaces are introduced at the sidewalls of the pits. The provision of these free-surfaces causes some or all of the elastic strain in the AlGaN layer to be relieved in the vicinity of the free surface. This complete or partial relaxation of the elastic strain in the AlGaN layer occurs in the plane parallel to the substrate growth surface, and in a direction perpendicular to the plane of the free surface of the pit sidewall. The complete or partial relaxation of the elastic strain results in a change in the ASLP of the AlGaN layer 16 in the vicinity of the pit sidewalls, compared with the ASLP of the AlGaN layer 16 before the pits were etched.

The extent of the relaxation of the elastic strain, and therefore the value of the ASLP of the AlGaN layer 16, depends on the depth of the pits, the shape (projected on the growth surface) of the pits, the cross-sectional profile of the sidewall of the pits, and the distribution of pits over the surface of the AlGaN layer 16.

Figure 3:
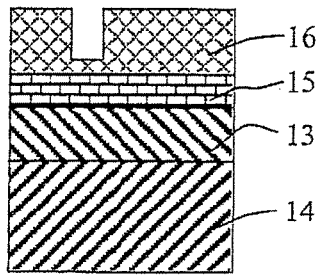
FIG. 3a is a schematic cross-sectional view of strain-relieving pits etched into the surface of an elastically strained surface layer.
FIG. 3b is a schematic cross-sectional view of strain-relieving pits etched into the surface of an elastically strained surface layer.
FIG. 3c is a schematic cross-sectional view of strain-relieving pits etched into the surface of an elastically strained surface layer.
FIG. 3d is a schematic plan view of strain-relieving pits etched into the surface of an elastically strained surface layer.
FIG. 3e is a schematic plan view of strain-relieving pits etched into the surface of an elastically strained surface layer.
FIG. 3f is a schematic plan view of strain-relieving pits etched into the surface of an elastically strained surface layer.
FIG. 3g is a schematic plan view of strain-relieving pits etched into the surface of an elastically strained surface layer.
Figure 3:
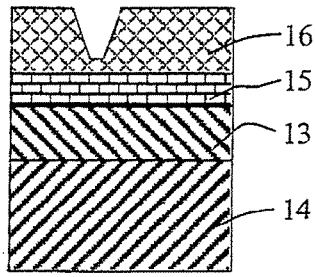
Figure 3:
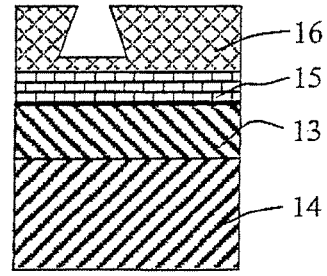
Figure 3:
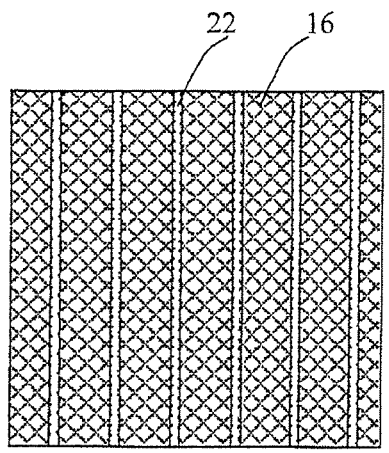
Figure 3:
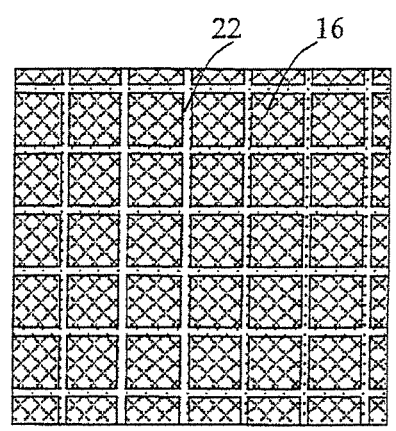
Figure 3:
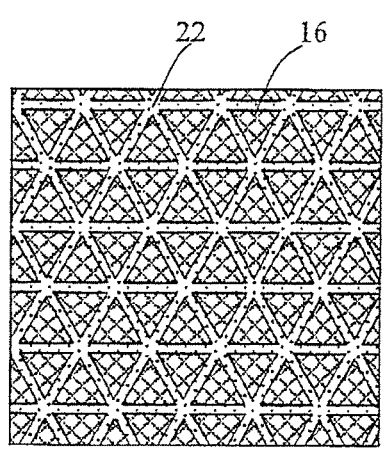
Figure 3:
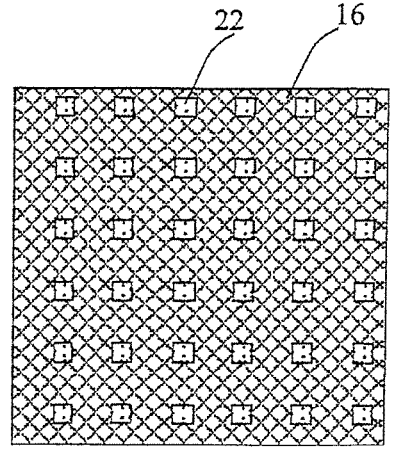

FIGS. 3a-3c show cross-section schematic diagrams of examples of pit sidewall shapes. FIG. 3a shows a pit with vertical sidewalls. FIG. 3b shows a pit with sidewalls with an outgoing surface normal making an angle of less than 90° with the outgoing surface normal of the original surface. FIG. 3c shows a pit with sidewalls with an outgoing surface normal making an angle of more than 90° with the outgoing surface normal of the original surface.

FIGS. 3d-3g are plan view schematic diagrams of possible examples of distributions and shapes of pits across the surface. FIG. 3d shows a grating pattern of elongate pits 22 in which the pits 22 are elongate and extend parallel to one another across the breadth of the AlGaN layer 16. FIG. 3e shows a rectangular grid pattern of pits 22 in which a first set of elongate pits extend parallel to one another across the breadth of the AlGaN layer 16 and a second set of elongate pits extend parallel to one another and substantially perpendicular to the first set of elongate pits. FIG. 3f shows a triangular grid pattern of pits 22 in which a first set of elongate pits extend parallel to one another across the breadth of the AlGaN layer 16 and a second set of elongate pits extend parallel to one another and crossed with but not perpendicular to (for example at 60° to) the first set of elongate pits. FIG. 3g shows a array of pits 22, each having finite extent in both the breadth and length directions, arranged in a regular array; FIG. 3g shows the pits 22 as square in shape, and arranged in a square array, but the shape of the pits and/or the array could differ from those shown in FIG. 3g. It should be understood that FIGS. 3d to 3g show only examples of possible strain-relieving pits, and the invention is not limited to these particular examples. Any suitable arrangement of strain-relieving pits may be used.

The relaxation of the elastic strain in the AlGaN layer 16 occurs in the direction perpendicular to the sidewall of the pit. Therefore, in the case of a distribution of pits such as shown in FIG. 3d, the surface lattice parameters measured along a crystallographic direction parallel to the sidewalls of the pits are substantially unchanged by the etching of the pits and the surface lattice parameters measured along a crystallographic direction perpendicular to the sidewall of the pits are changed by the etching of the pits. In the case of the distribution of pits such as shown in FIG. 3e, however, the surface lattice parameters are changed along crystallographic directions perpendicular to the pit sidewalls in two perpendicular directions. In both cases however, (and also in the cases of FIG. 3f and FIG. 3g), the ASLP of the AlGaN layer 16 after the pits have been etched in it is different to the ASLP before the etching of the pits.

By selection of appropriate pit depth, pit shape, pit sidewall design and/or pit distribution pattern, the extent of relaxation of the elastic strain in the AlGaN layer 16 can be controlled. Depending on the selection of the pit depth, pit shape, pit sidewall design and/or pit distribution pattern, the surface lattice parameter may be substantially the same in the region in between pits, or the surface lattice parameter may vary in the region between pits. The combination of a particular pit depth, a particular pit shape, a particular pit sidewall design, and a particular pit distribution pattern is referred to hereafter as a pit pattern design (PPD).

The distribution of pits over the surface of the AlGaN layer 16 may be defined using any suitable technique, for example any suitable lithography technique, such as optical lithography, electron beam lithography, interference lithography or imprint lithography, and the pits are then etched using any suitable etching technique such as inductively coupled plasma etching using conditions which deliver the desired pit depth, shape and sidewall profile. After the pits are etched, an insulating dielectric material 21 such as silicon dioxide, is deposited using a technique such as plasma-enhanced chemical vapor deposition, so that the dielectric material fills the etched pits and protrudes above the top surface of the AlGaN layer 16.

Figure 4:
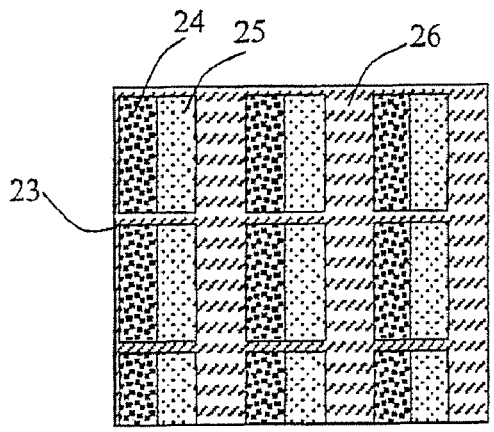
FIG. 4a is a plan view of a substrate, according to an embodiment of the present invention.
FIG. 4b is a plan view of the substrate of FIG. 4a after deposition of a contact.
FIG. 4c shows a plan view of a discrete chip cut from the substrate shown in FIG. 4a or 4b.
Figure 4:
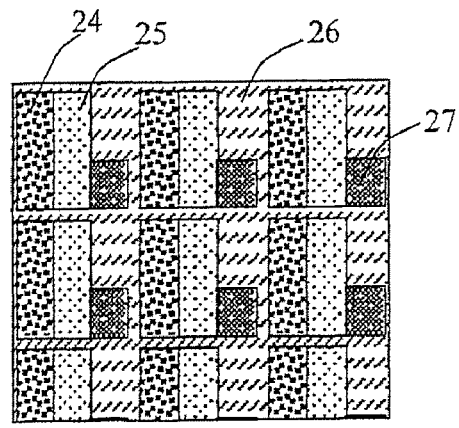
Figure 4:
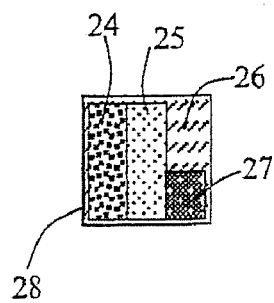

In this first embodiment, pits according to a first PPD are etched in a set of first regions of the surface of the AlGaN layer 16 (corresponding to the regions 2 of FIG. 1a) and pits according to a second PPD are etched in a set of second, different regions of the surface of the AlGaN layer 16 (corresponding to the regions 3 of FIG. 1a). In principle, pits may be etched in both the first regions and the second regions in one processing step, or pits may be etched in the first regions in one processing step and pits may be etched in the second regions in a separate processing step. For example, pits in the first regions may have a first sidewall design and pits in the second regions may have a second, different sidewall design thereby to obtain a first PPD in the first regions and a second PPD in the second regions. As a further example, pits in the first regions may additionally or alternatively have a first distribution pattern and pits in the second regions may have a second, different distribution pattern. No pits are etched in any regions of the surface of the AlGaN layer 16 which are not included in either the set of first regions or set of second regions. The regions of the surface where no pits are etched form a set of third regions, different from the first regions and from the second regions. The sets of first and second regions are distributed so that, when the substrate is divided into individual chips later on in the fabrication process, each chip contains at least one region of the first PPD, at least one region of the second PPD and at least one region where no pits have been etched. This is illustrated in FIG. 4a, which shows a plan view schematic diagram of a portion of a substrate 23 and shows the distribution of regions 24 and 25 in which, respectively, the first PPD and second PPD are used, and the locations of the remaining regions 26.

Owing to the different PPDs, the ASLP of the AlGaN layer 16 differs between regions 24, 25 and 26, having a first value in first regions 24, a second value in second regions 25, and a third value in third regions 26. For further description it will be assumed that the PPDs are such that the ASLP in regions 24 is smaller than the ASLP in regions 25, which is itself smaller than the ASLP in regions 26. The three types of regions may be obtained by providing pits in all three types of region, with each type of region having a different PPD from the other types of regions. Alternatively, one type of region may have no pits formed, so as to retain its original ASLP.

Figure 2:
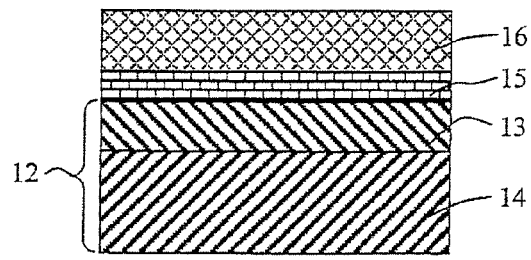
FIGS. 2a-2d are cross-sectional views showing steps of fabricating a quantum dot light emitting device according to a first embodiment of the present invention.
Figure 2:
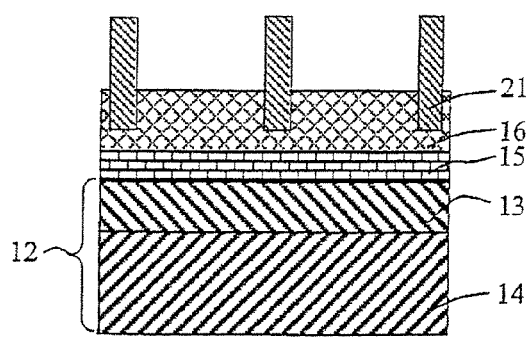
Figure 2:
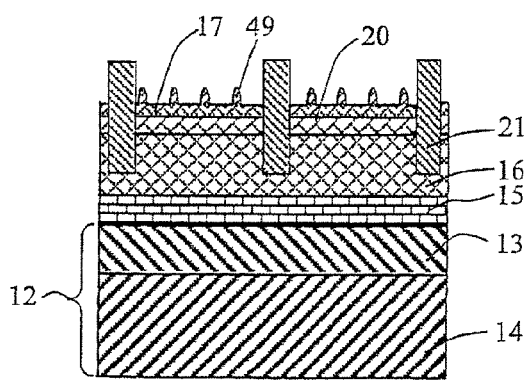
Figure 2:
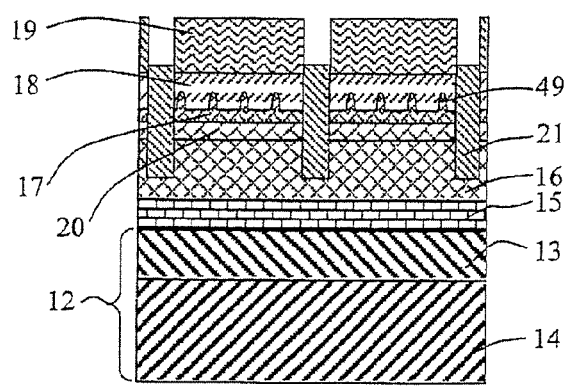

FIG. 2b shows a cross-sectional schematic of the heterostructure substrate after etching a pattern of pits with one particular PPD (i.e. in one of the regions 24 or 25—FIG. 2b does not show all regions 24, 25, 26 of FIG. 4a) and after the pits have been filled with an insulating dielectric material 21 such as silicon dioxide. The heterostructure substrate is then returned to the MBE deposition equipment and used as a substrate for growth of an active region containing quantum dots formed by self-assembled island formation. To do this, the substrate is cleaned by any method suitable for cleaning a substrate and a buffer layer 20, in this example an AlGaN buffer layer, is deposited onto the substrate. Next a layer, for example an $In_xGa_{1-x}N$ (where $0 \leq x \leq 1$; hereafter referred to as InGaN) layer, is grown in an SK mode on the heterostructure substrate. The InGaN wetting layer 17 and self-organised InGaN islands 49 are shown in FIG. 2c.

Owing to the difference in ASLP between regions 24, and 26, the critical thickness for the self-organised formation of InGaN islands is different in the three types of regions. The critical thickness in regions 24 is smaller than the critical thickness in regions 25 which is itself smaller than the critical thickness in regions 26. The E2DT of material which is deposited during the growth of the SK layer is substantially the same in all regions of the substrate and is chosen to exceed the critical thickness in regions of all three types 24, 25 and 26. Therefore self-organised islands form in all three types of region. However, since the critical thickness in region 24 is smaller than the critical thickness in region 25, the volume of material which is accommodated into islands in region 24 is larger, and the average height of self-organised islands in region 24 is larger, than in region 25. Similarly, the volume of material which is accommodated into islands in region 25 is larger, and the average height of self-organised islands in region 25 is larger, than in region 26.

After formation of the islands, a capping layer 18 is grown over the wetting layer 17 so as to cover the self-organised islands 49. The capping layer 18 is formed of a material that has a greater forbidden band-gap than the material of the self-organised islands so that, as explained above, the self-organised islands 49 constitute quantum dots.

The strained layer 16 must also have a bandgap greater than the bandgap of the self-organised islands (as will be the case for $In_xGa_{1-x}N$ ($0 \leq x \leq 1$) self organised islands and an $Al_yGa_{1-y}N$ ($0 < y \leq 1$) layer 16).

In the case of InGaN self-organised islands 49, a suitable material for the capping layer 18 is, for example, $Al_xIn_yGa_{1-x-y}N$ (where $0 \leq x \leq 1$ and $0 \leq y \leq 1$). In the embodiment of FIGS. 2a to 2d, therefore, an $Al_xIn_yGa_{1-x-y}N$ capping layer 18 which covers the InGaN islands 49 and a p-type GaN layer 19 are grown, in this order, on the substrate, as shown in FIG. 2d.

The p-type GaN layer 19 is to complete the p-n junction needed to make an LED. In FIG. 2d the layer 19 is shown as not overgrowing the dielectric material 21 because this is what usually happens in practice, although it is possible that polycrystalline GaN may form on top of the dielectric material 21. The primary purpose of the dielectric material 21 is to ensure that any current passing between the p-type layer 19 and the n-type layer 16 must pass through the active region (i.e. the dielectric material 21 blocks any direct path between the p-type layer 19 and the n-type layer 16 which bypasses the active region).

Metallic contacts to the p-type layer 19 and n-type GaN buffer layer 15 are prepared using any method suitable for fabricating contacts to LEDs in III-nitride materials. For example, a nickel layer and a gold layer may be deposited, in that order, onto the surface of the p-type GaN layer 19 using a technique such as thermal evaporation to form an electric contact to the p-type material and a contact to the n-GaN layer is prepared by first etching down to the n-GaN layer, using a technique such as inductively coupled plasma etching, in portions 27 of the regions 26 and then depositing a titanium layer and an aluminium layer, in that order, using a technique such as electron beam evaporation. FIG. 4b shows the substrate after deposition of the contact to the n-GaN in portions 27 of the regions 26. The contact (not shown in FIG. 4b) to the p-type GaN layer may be divided using etching so that the contact layers in regions 24, 25 and 26 are all isolated from one another.

After fabrication of the contacts the substrate is divided into individual chips using any method suitable for dividing a substrate, such as sawing or cleaving. The resulting chip structure is shown schematically in FIG. 4c. Each individual chip 28 contains regions 24, 25 and 26 each containing an electrical contact (not shown) to the p-type GaN layer 19, and a contact 27 to the n-type GaN layer. If the contact to the p-type GaN is divided so that the contact layers in regions 24, 25 and 26 are all isolated from one another, each region 24, 25 and 26 is an individually addressable LED with an active region containing quantum dots with different heights and therefore with different emission properties compared with the other two regions.

The differences in average height of the InGaN quantum dots between regions 24, 25 and 26 cause differences in the average emission wavelength from these regions. In the case of nitride quantum dots with the wurtzite structure being grown along polar or semi-polar crystallographic directions, such as [0001], the dependence of the emission wavelength on the height of quantum dots is very strong because of the intrinsic spontaneous and piezoelectric fields in the quantum dots.

Owing to the dependence of the InGaN quantum dot emission wavelength on the height of the quantum dot, the dominant wavelength of light emitted from the LEDs formed in regions 24, 25 and 26 are different. In one embodiment, for example, the light emitted from regions 26 has a peak emission wavelength between 400 nm and 470 nm (perceived as blue light), the light emitted from regions 25 has a peak emission wavelength between 470 nm and 570 nm (perceived as green light) and the light emitted from regions 24 has a peak emission wavelength between 570 nm and 640 nm (perceived as red light). If the contacts to the regions 24, 25 and 26 are isolated from one another so that the LEDs with different emission wavelengths may be controlled individually by application of appropriate electrical bias between the n-contact (which is common to all three LEDs) and each individual p-contact. The overall light output from the chip may therefore be varied by driving one or more of the region 24, 25 and 26 to emit light.

The invention is not limited to the specific wavelength ranges mentioned above. As an example, the differences between the emission wavelengths of the three regions 24, 25, 26 may be lower than in the example above.

The epitaxial deposition method used to deposit the layers in the embodiment described above is MBE. However, as is readily understood by those skilled in the art, the embodiment could alternatively be implemented using other epitaxial deposition techniques, such as MOVPE, instead of MBE. In addition, a combination of two or more different epitaxial deposition techniques may be used in a single implementation of the embodiment. For example, the layers deposited on the substrate prior to the etching of the pits may be deposited using one technique, for example, MOVPE and the remaining layers may be deposited using another technique, for example MBE.

In the embodiment described above the base substrate for the epitaxial growth was sapphire. The invention is not limited to this and other base substrates can readily be used instead of sapphire including, but not limited to, $Al_xIn_yGa_{1-x-y}N$ (where $0 \leq x \leq 1$ and $0 \leq y \leq 1$), silicon, silicon carbide and glass.

$Al_xIn_yGa_{1-x-y}N$ material with any of the polytypes known to exist for nitride materials may be used for this embodiment, including the hexagonal wurtzite structure and the cubic sphalerite structure. The growth direction of the nitride material may be along any crystallographic direction.

In the embodiment described above the ASLP is adjusted between regions of the substrate using controlled relaxation of the elastic strain in an AlGaN layer 16 grown epitaxially on GaN. A fully or partially strained $In_xGa_{1-x}N$ ($0 \leq x \leq 1$) layer can be used in place of the AlGaN layer. Alternatively a stack containing any combination of fully or partially strained $Al_xIn_yGa_{1-x-y}N$ layers (where $0 \leq x \leq 1$ and $0 \leq y \leq 1$) with different compositions may be used instead of the AlGaN layer 16. In general, the layer 16 and the layer 17 may belong to the (Al,In,Ga)N system (provided that, as noted above, the layer 16 has a greater bandgap than the self-organised islands formed in the wetting layer 17). The (Al,In,Ga)N system denotes materials of the form $Al_xIn_yGa_{1-x-y}N$ where $0 \leq x \leq 1$ and $0 \leq y \leq 1$.

Furthermore, the invention is not limited to varying the ASLP by providing stress-relieving structures in the strained layer 16, and any suitable method which provides controlled variations in the ASLP of a substrate may be used prior to the growth of the SK quantum dot layer to achieve similar control over properties of the SK layer. One example of such an alternative technique is to use lateral overgrowth techniques to prepare substrates with regions with different ASLP.

The principles of lateral overgrowth techniques are described in, for example, P. Gibart "Metal organic vapor phase epitaxy of GaN and lateral overgrowth" Rep. Prog. Phys. 67 667 (2004). The preparation of a semiconductor surface with regions with different ASLP using lateral overgrowth techniques is shown in FIGS. 8a and 8b, which are cross-sectional schematic diagrams at two different stages of the preparation process.

A first step is to prepare $Al_xIn_yGa_{1-x-y}N$ (where $0 \leq x \leq 1$ and $0 \leq y \leq 1$) crystalline "seeds" 42 on a substrate 38. For the example illustrated in FIGS. 8a and 8b, the substrate 38 is a template substrate consisting of a GaN layer 39 grown over a sapphire base substrate 40. One method for forming the seeds 42 is to deposit a $SiO_2$ mask 41 onto the substrate 38, fabricate apertures in this mask and deposit $Al_xIn_yGa_{1-x-y}N$ onto the substrate such that the $Al_xIn_yGa_{1-x-y}N$ crystals only form in the apertures of the mask (i.e. where the original substrate surface is exposed) and such that the $Al_xIn_yGa_{1-x-y}N$ seeds 42 grow along the direction perpendicular to the plane of the substrate. FIG. 8a shows the substrate after formation of the $Al_xIn_yGa_{1-x-y}N$ seeds 42.

Figure 8:
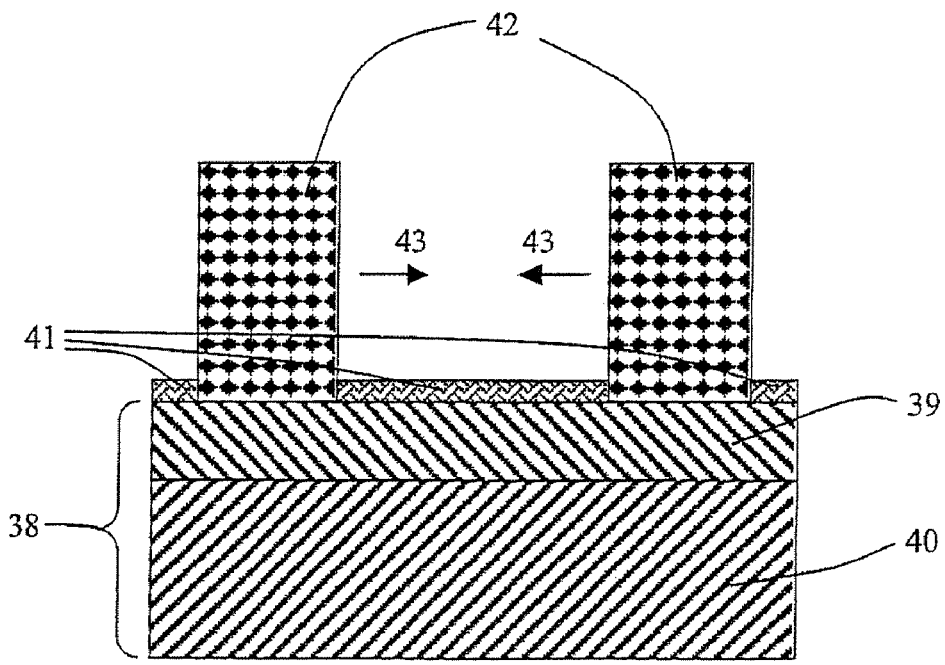
FIGS. 8a-8b show cross-sectional views of steps in a method for preparing a surface with pre-determined regions with different average surface lattice parameters using lateral overgrowth techniques.
Figure 8:
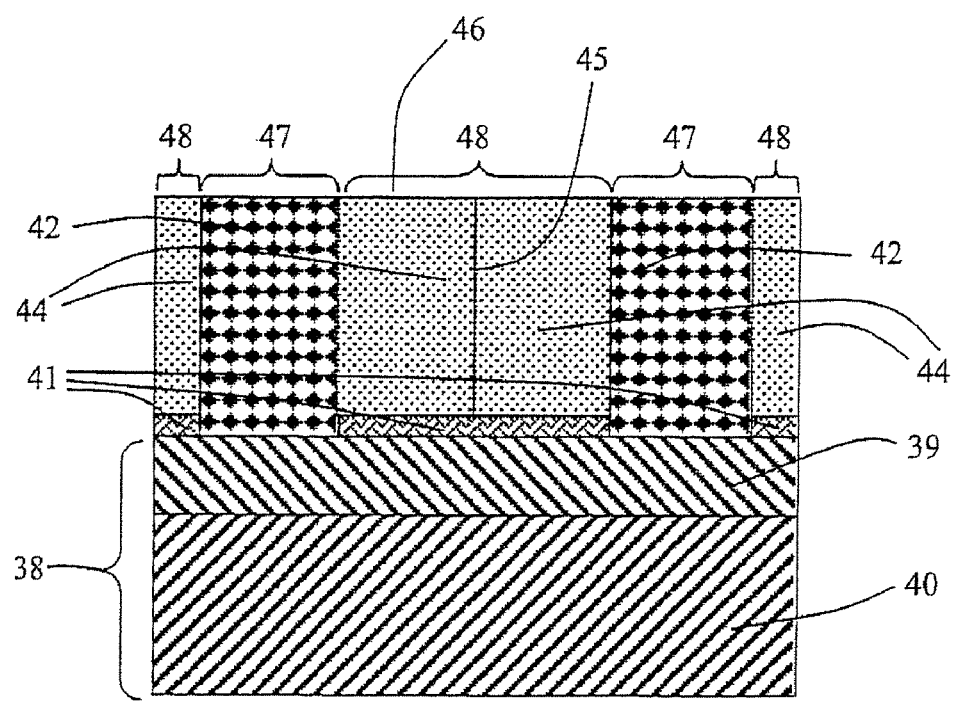

Once the $Al_xIn_yGa_{1-x-y}N$ seeds 42 have been formed, $Al_xIn_yGa_{1-x-y}N$ "wings" 44 are grown using epitaxial deposition conditions which result in "lateral" growth along a direction lying in the plane of the substrate 38 (i.e. along a direction indicated by arrows 43 in FIG. 8a). The growth of the wings 44 is continued until wings growing from adjacent seeds 42 coalesce with each other at a coalescence boundary 45, as shown in FIG. 8b. Lateral overgrowth methods such as illustrated in FIGS. 8a and 8b are conventionally used as a method to reduce the density of crystalline defects, such as dislocations, at the surface of a substrate. However, for the present invention, the lateral overgrowth methods are used as a means of providing a surface with different ASLP in different pre-determined regions of the surface. The top surface 46 of the structure shown in FIG. 8b consists of two distinct types of region: the regions which contain the seeds 42 (these regions are labeled 47 in FIG. 8b); and the regions of the surface 46 which contain the wings 44 (these regions are labeled 48 in FIG. 8b). The seeds 42 are substantially strained to the GaN layer 39 of the substrate such that the ASLP in regions 47 of the surface is substantially the same as the ASLP of the original GaN layer 39. The wings are elastically relaxed along their growth direction (i.e. parallel to the arrows labeled 43 in FIG. 8a) so the ASLP in the regions 48 of the surface depends on the composition of the $Al_xIn_yGa_{1-x-y}N$ wings 44. The composition of the wing material is chosen so that the elastically relaxed lattice parameters of the wing material are different from the equivalent lattice parameters in the seeds 42. Therefore, a surface 46 containing pre-determined regions with different values of ASLP is prepared. The distribution of the regions with different ASLP over the surface is controlled by controlling the positions at which the seeds 42 are formed.

The embodiment described above used active regions containing quantum dots formed by self-organised growth of InGaN islands. However, deposition of $Al_xGa_{1-x}N$ ($0 \leq x \leq 1$) in a SK mode may be used instead of InGaN.

The embodiment described above used a single layer of self-assembled InGaN islands. In a variation on this embodiment, after the growth of the capping layer 18, a second deposition of InGaN can be made so that a second layer of self-organised islands forms. This second layer can itself be capped and the process repeated to form a stack containing any desired number of layers of InGaN quantum dots. If after growth of the capping layer 18 the ASLP of the capping layer 18 varies in a similar manner to the ASLP of the AlGaN layer 16, subsequent SK layers can demonstrate similar differences in self-organised island properties between the individual regions. No additional treatment would be required for the additional layers, and the variations in ASLP "carry through" from the layer 16 to the capping layer 18. The successive layers can be grown immediately after one another, without removing the sample from the epitaxial deposition equipment in between layers.

The deposition conditions of InGaN may, or may not be the same for all of the layers in this stack. Providing two or more layers of quantum dots increases the output light intensity from the resultant chip.

Figure 9:
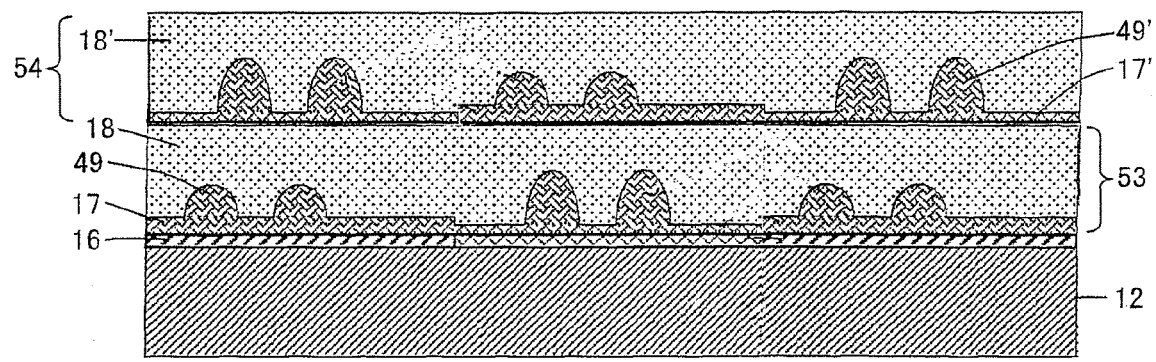
Figure 9:
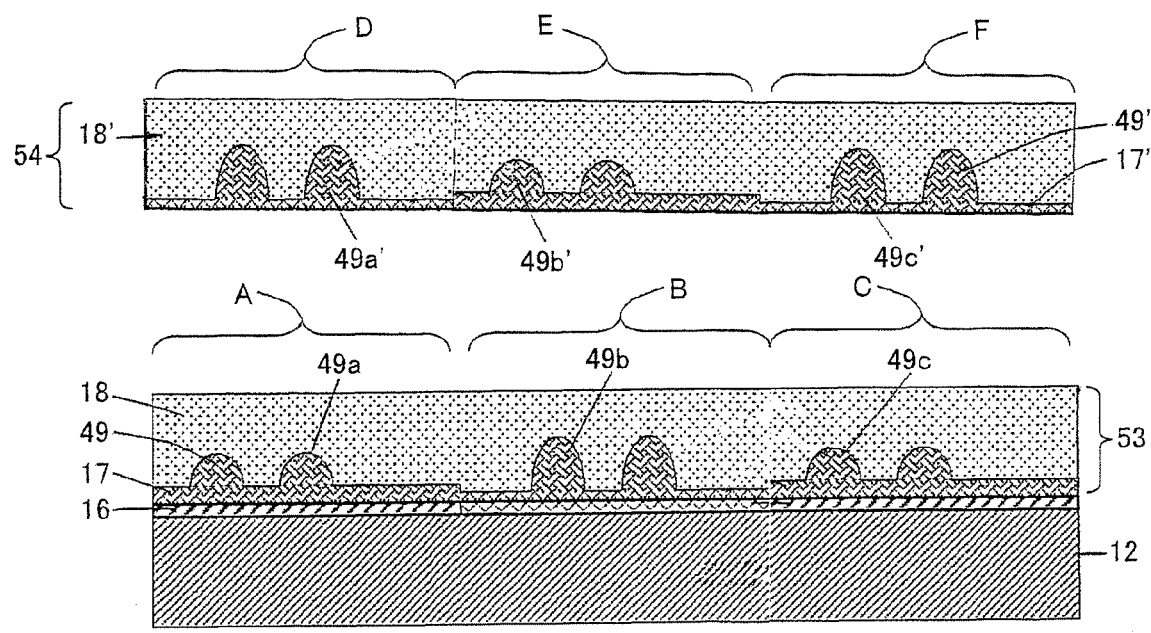

FIG. 9a is a schematic cross-sectional view of a device that incorporates two layers of quantum dots. The device comprises a semiconductor layer, for example an Al,Ga,N layer 16 disposed over a substrate 12. The layer 16 is treated so as to provide at least a first region having a first value of the ASLP and at least one second region having a second, different value of the ASLP. In the embodiment of FIG. 9a the layer 16 has first, second and third regions in which the ASLP takes first, second and third values, respectively, with the first, second and third values of the ASLP being different from one another.

A layer is grown in a SK mode on the layer 16 to a thickness at which a wetting layer 17 and self-organised islands 49 form. The layer grown in the SK mode may be an (Al,In,Ga)N layer, for example an InGaN layer, having a lower bandgap than the layer 16. Since the value of the ASLP of the layer 16 differs between the three regions, self-organised islands 49a in the first region A will have a first average value of a parameter, self-organised islands 49b in the second region B will have a second average value of the parameter, and self-organised islands 49c in the third region C will have a third average value of the parameter, with the first, second and third average values being different from one another. The parameter may be any of the parameters described above such as, for example, the height of the self-organised islands.

A capping layer 18 is provided over the wetting layer 17 and self-organised islands 49. As described above, providing the capping layer 18 causes the self-organised islands 49, 49a, 49b, 49c to form quantum dots. The combination of the wetting layer 17, self-organised islands 49a, 49b, 49c and the capping layer 18 acts as a first active layer 53.

A second layer is then grown in a SK mode on the upper surface of the capping layer 18 to a thickness at which a wetting layer 17' and self-organised islands 49' form in the second layer. Provided that the ASLP of the capping layer 18 varies in a similar manner to the ASLP of the layer 16, self-organised islands 49a' formed in region D of the second SK layer (which is over region A of the first wetting layer), self-organised islands 49b' formed in region E of the second SK layer (over region B of the first wetting layer 17) and self-organised islands 49c' formed in region F of the second SK layer (over region C of the first wetting layer 17) will be different from one another—that is, they will have different values of a parameter such as any of the parameters mentioned above.

A second capping layer 18' is disposed over the second wetting layer 17' and self-organised islands 49'. As a result, the self-organised islands 49a', 49b' and 49c' formed on the second wetting layer 17' form quantum dots—and, as the self-organised islands 49a', 49b', 49c' in the three regions of the second wetting layer 17 are different from one another, the resultant quantum dots will therefore have different properties from one another. That is, the fourth quantum dots formed from the self-organised islands in region D of the second wetting layer 17' will have different properties from the fifth quantum dots formed from the self-organised islands 49b' in region E of the second wetting layer 17' (with, in turn, the sixth quantum dots formed from the self-organised islands 49c' in region F of the second wetting layer 17' having yet different properties).

The second capping layer 18', self-organised islands 49a', 49b', 49c' and the second wetting layer 17' together constitute a second active region. FIG. 9b is a schematic sectional view that corresponds to FIG. 9a, but shows the second wetting layer 17' and second capping layer 18' separated from the lower wetting layer 17 and the lower capping layer 18. This is to allow clarity of labeling of the various components of the device.

Provided that the ASLP of the second capping layer 18' varies between regions D, E and F, it would be possible to dispose a further layer grown in a SK mode and a further capping layer over the second capping layer 18' of FIG. 9a and obtain a further active region containing quantum dots having different properties to one another; yet further layers grown in a SK mode and capping layers may be provided if desired.

Preferably, the second active region 54 has generally similar properties to the first active region 53. In the case of a light-emitting device, each active region 53, 54 would, in one example, preferably comprise a region in which the quantum dots had a peak emission wavelength in the red spectral region, a region in which the quantum dots had a peak emission wavelength in the green spectral region and a region in which the quantum dots had a peak emission wavelength in the blue spectral region—so that the provision of two active regions would increase the output light intensity of the device (compared to a device having only one active region).

It should be noted that the sizes of the self-organised islands and the thicknesses of the wetting layers shown in FIGS. 9a and 9b have been chosen simply to illustrate that the wetting layer and self-organised islands 49a,49b,49c; 49a', 49b',49c' in different regions A,B,C;D,E,F have different sizes from one another, and are not intended to show the relative sizes of the self-organised islands or the relative thicknesses of the wetting layers in different regions to scale. In practice if region A has larger self-organised islands than region B or C (as an example) then it is likely that region D will have larger self-organised islands than region E or F since the difference in size of self-organised islands in regions D, E and F derives ultimately from the differences in ASLP of the layer 16.

It should be noted that a number of layers have been omitted from FIG. 9a for clarity. For example, a practical implementation of this embodiment would in general comprise a buffer layer between the substrate 12 and the layer 16, and would also comprise a buffer layer between the layer 16 and the wetting layer 17. Furthermore, FIG. 9a does not illustrate a mechanism by which the layer 16 is provided with regions having different ASLP—this may be done by, for example, providing pits in the layer 16 as described above.

The substrate 12 is not described in any detail in FIG. 9a. The substrate 12 may be a substrate as described with reference to FIG. 2a above.

If desired, a laser device may be disposed on the lower surface of the substrate 12, as described with reference to FIG. 7 below.

A layer may be provided over the upper surface of the device of FIG. 9a to complete the p-n junction of an LED (similar to the layer 19 of FIG. 2d).

In the embodiment described above three types of regions with different ASLP were used to prepare a LED with regions emitting three different dominant wavelengths. The method can be extended to use of any desired number of types of region, for example regions emitting two different dominant wavelengths or regions emitting four or more different dominant wavelengths, each region distinguished by having an ASLP different from the other regions. Consequently, LEDs with any desired number of dominant emission wavelengths can be fabricated. The desired dominant emission wavelengths need not be within the wavelength ranges listed for the embodiment above.

The fraction of the area of the substrate growth surface which is patterned with each PPD can be varied as desired. For example, if the luminescence efficiency from the quantum dot active region formed in region 25 is lower than the luminescence efficiency from the quantum dot active region formed in region 24, a larger proportion of the growth surface of the substrate can be occupied by regions 25 to compensate for the lower luminescence efficiency.

In the embodiment described above an AlGaN buffer layer 20 is grown immediately prior to the growth of the self-assembled InGaN islands. Alternatively, a stack containing any combination of $Al_xIn_yGa_{1-x-y}N$ layers (where $0 \leq x \leq 1$ and $0 \leq y \leq 1$) may be used instead of the AlGaN buffer layer 20, provided that the ASLP at the top of the stack is substantially the same as at the surface of the AlGaN layer 16. Alternatively, the growth of the wetting layer 17 and the self-assembled InGaN islands 49 can occur directly on the AlGaN layer 16, without growth of any buffer layer.

In the embodiment described above the contact to the p-type GaN layer is divided using etching so that the contact layers in regions 24, 25 and 26 are all isolated from one another. With these isolated contacts, the electrical bias which is applied across the active regions may be different between the three regions. Alternatively, the contact layers in regions 24, 25 and 26 need not be isolated from one another so that during operation of the device the same bias is applied across the active regions in all three regions.

The embodiment described thus far has been for the example of an LED formed from nitride semiconductor materials. However, as is clear to those skilled in the art, the method may be adapted and applied to LEDs with self-organised active regions formed from any other semiconductor material which can undergo growth in the SK mode. These other semiconductors include any III-V compounds (a compound containing elements from group three of the periodic table and from group five of the periodic table) such as $In_xGa_{1-x}As$ ($0 \leq x \leq 1$), any II-VI compounds (a compound containing elements from group two of the periodic table and group six of the periodic table) and $Si_xGe_{1-x}$ ($0 \leq x \leq 1$).

A light emitting device and a method for fabricating the same according to a second embodiment of the present invention will be described with reference to FIG. 5a-5b.

Figure 5:
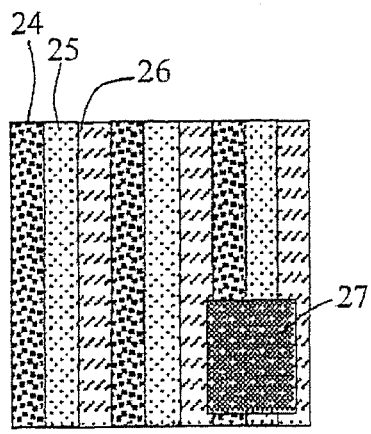
FIG. 5a is a plan view of discrete chips according to another embodiment of the present invention.
FIG. 5b is a plan view of discrete chips according to another embodiment of the present invention.
Figure 5:
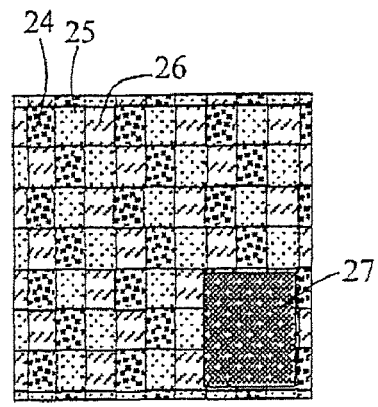

The light emitting device in FIG. 5a or 5b is fabricated using generally the same method as the device according to the first embodiment. However, the distribution of different PPD zones over the substrate is chosen so that, after division of the substrate to yield individual chips, at least one PPD is present in more than one zone of the chip. FIG. 5a is a plan view of chip according to this embodiment, and show an example where zones 24,25,26 of three different PPD have the form of rows extending across the chip. The chip contains two or more zones 24,25,26 of each different PPD—FIG. 5a shows the chip as containing three zones 24,25,26 of each different PPD, but the invention is not limited to this. FIG. 5b is a plan view of another chip according to this embodiment and shows another example where the zones 24,25,26 of three different PPD have a finite extent in both the length and breadth dimensions and are interdispersed with one another in two dimensions. Again, the chip of FIG. 5b may contain any desired number of the zones 24,25,26 of three different PPD. The distribution of the same type of zone over the chip ensures that, when the light emitted by the device is viewed in the far field, there is improved mixing of the light emitted from each type of zone compared with the case where the zones are not distributed across the chip.

In this embodiment, a single electrical contact may be made to all of the zones on the chip so that the same electrical bias is applied across active regions in all types of zones during operation of the light emitting device. Alternatively, the electrical contacts to the different zones may be isolated from one another so that individual electrical bias can be applied, to allow zones of one type to be controlled independently from zones of another type.

A light emitting array and a method for fabricating the same according to a third embodiment of the present invention is fabricated using a similar method to the first embodiment.

The distribution of different PPD zones is chosen so that a repeat unit composed of zones of two or more PPD is distributed over the substrate surface in the form of a two-dimensional array. After the epitaxial growth steps of the first embodiment, the electrical contacts to the array are fabricated so that each zone can be individually addressed with an electrical bias according to the row and column of the said zone in the array. The emission wavelength from the active regions formed in each PPD within the repeat unit are different. Therefore, this embodiment provides a two-dimensional light-emitting matrix array containing pixels with two or more emission wavelengths.

The third embodiment requires a periodic placement of different PPD zones so that a two-dimensional array is formed. In contrast, the second embodiment is directed to obtaining improved mixing of light from each type of PPD zone and does not require periodic placement of different PPD zones.

A laser diode and a method of fabricating the same according to a fourth embodiment of the present invention will be described with reference to FIGS. 6a-6c.

The laser diode according to the fourth embodiment shares many features with the device according to the first embodiment. In particular, the method used to cause quantum dots formed by self-assembled island growth to have different properties in different regions of the substrate is the same as that described for the first embodiment. These features which are common between the fourth embodiment and the first embodiment will not be repeated in detail.

According to the method described for the first embodiment, quantum dot ensembles with different properties were formed in different pre-determined regions of the substrate and used as the active region of light emitting diodes. According to this fourth embodiment, these quantum dot ensembles are used in the active region of laser diodes so that quantum dot laser diodes with two or more emission wavelengths are fabricated on a single substrate.

The epitaxial growth of the heterostructure for a device according to this fourth embodiment can be the same as for the first embodiment, apart from the preferred distribution of regions of different PPD across the substrate. FIG. 6a shows a plan view diagram of a substrate 30 showing distribution of two PPDs 31 and 32, across the substrate in the fourth embodiment. After the growth of the heterostructure layers shown in FIG. 2d and described previously for the first embodiment, the substrate is processed to form laser diode devices using structures well known in the prior art, such as a ridge-waveguide laser structure or a gain-guided laser structure.

Lasing cavities of individual laser devices are positioned above regions of the substrate containing solely the first PPD 31 or solely the second PPD 32. For example, for the case of a ridge waveguide laser structure, the lasing cavity is defined by the position of the ridge waveguide and current is injected into the laser structure only in the region where the ridge waveguide is fabricated.

Figure 6:
Figure 6:
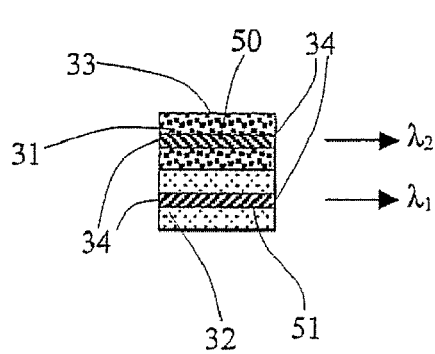
Figure 6:
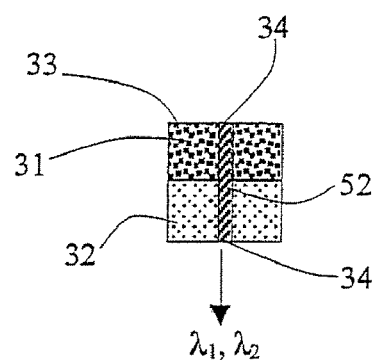

FIG. 6b shows schematically a chip cut from the substrate after processing to form laser cavities 50 and 51; in the case of a ridge waveguide laser as an example, the laser cavities 50, 51 are defined by forming corresponding ridges over the substrate. The laser cavity 50 is positioned on a region of the substrate which had been patterned with the first PPD 31. The laser cavity 51 is positioned on a region of the substrate which had been patterned with the second PPD 32. The laser cavity ends are defined by reflective mirrors 34. As a consequence of the different PPDs 31, 32 and for the reasons detailed above for the first embodiment, the quantum dots in a first part of the active region of the chip (corresponding to laser cavity 50) have properties different from the quantum dots in a second part of the active region of the chip (corresponding to laser cavity 51). Since the emission wavelength of a quantum dot laser depends on the properties (such as the size, shape and composition) of the quantum dots in the active region of the laser cavity, the active region of the first laser cavity 50 has a lasing wavelength different from the lasing wavelength of the active region of the second laser cavity 51. This difference in lasing wavelength is signified in FIG. 6b by arrows labeled $\lambda_1$ and $\lambda_2$, where the arrows indicate the direction of the light emitted during lasing and $\lambda_1$ and $\lambda_2$ are the lasing wavelengths of the two devices (with $\lambda_1 \neq \lambda_2$). Thus the individual chip 33 of FIG. 6b contains two adjacent laser devices with different emission wavelengths, formed monolithically on a single substrate.

Although the description for the fourth embodiment given above has been restricted to fabricating devices with two different lasing wavelengths, by appropriate selection and distribution of different PPD on a substrate, any desired number of laser diodes with different emission wavelengths can be positioned together on a single chip cut from the substrate. As an example, if the chip of FIG. 6b were to further include a region having a third PPD different from the first and second PPDs, the region of third PPD would form a third part of the active region of the chip.

FIGS. 2a to 2d show one possible layer structure for a device of the present invention, but the invention is not limited to this layer structure and additional heterostructure layers can be added to the heterostructure shown in FIG. 2d, for example to improve the confinement of light close to the active region and improve the lasing characteristics of the resultant devices. For example, the inclusion of optical guiding layers and cladding layers are well known in the prior art to be a means of reducing the minimum electrical injection current which is required for lasing to occur in a device and so, when the present invention is applied to a laser diode, the inclusion of these additional layers in the heterostructure is preferred.

In addition to the laser structures described above for which there is only a single type of PPD within each lasing cavity, a further extension of this fourth embodiment is for the PPD and lasing cavity positions to be chosen so that each lasing cavity contains regions of two or more different PPDs. With two or more types of active region in a single lasing cavity, there can be two or more lasing wavelengths simultaneously emitted from a single cavity. This may be achieved, for example, in the chip shown schematically in FIG. 6c where the lasing cavity 52 is crossed with, for example is perpendicular to, regions having different values of PPD 31,32, such that part of the lasing cavity 52 is positioned over the region having PPD 31 and part of the lasing cavity 52 is positioned over the region having PPD 32 such that stimulated emission occurs at two wavelengths from a single laser cavity. This lasing emission at two wavelengths is signified in FIG. 6c by an arrow labeled "$\lambda_1, \lambda_2$", where the arrow indicates the direction of light emitted from the device and $\lambda_1$ and $\lambda_2$ are the two lasing wavelengths.

A light emitting device and a method for fabricating the same according to a fifth embodiment of the present invention will be described with reference to FIG. 7.

The light emitting device according to the fifth embodiment shares many features with the first embodiment. In particular, the method used to cause quantum dots formed by self-assembled island growth to have different properties in different regions of the substrate is the same as that described for the first embodiment. Description of these features which are common between the fifth embodiment and the first embodiment will not be repeated in detail.

Whereas for the device of the first embodiment carriers were injected into the quantum dots from the p-type and n-type layers 19,15 on either side of the quantum dots when an electrical bias was applied between the p-type layer and the n-type layers, in this fifth embodiment the carriers are introduced in the quantum dots through absorption of photons.

Figure 7:
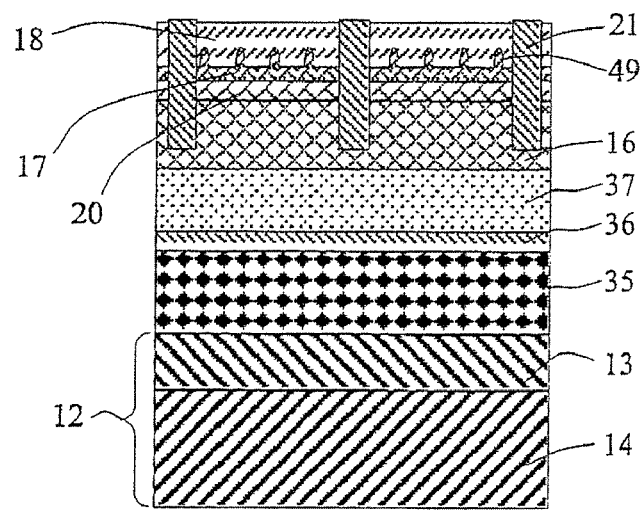
FIG. 7 shows a cross-sectional view of a light emitting device according to another embodiment of the present invention.

A cross-sectional schematic diagram of the heterostructure of part of the device is shown in FIG. 7. Prior to the growth of the elastically strained layer 16 described in the first embodiment, a light-emitting diode heterostructure is deposited onto the substrate 12. This light-emitting diode heterostructure consists, in this embodiment, of at least a n-type III-nitride layer 35, a III-nitride active region 36 and a p-type III-nitride layer 37.

The III-nitride active region 36 contains, for example, at least one $In_xGa_{1-x}N$ ($0 < x \leq 1$) layer.

The self-organised island formation on/over the elastically strained surface layer 16 is carried out using the same method as described for the first embodiment, with the one exception that the growth of the final III-nitride layer described in the first embodiment (the p-type layer 19) is omitted. The layers involved in the self-organised island growth which are common to the first and fifth embodiments, namely the optional buffer layer 20, the wetting layer 17, the self-organised islands 49 and the capping layer 18, are shown in FIG. 7. As detailed previously in the description of the first embodiment, the self-organised islands 49 constitute quantum dots.

In selected areas of the substrate, electrical contacts are made to the n-type layer 35 of the light-emitting heterostructure by etching from the growth surface (using, for example, inductively coupled plasma etching) to expose this n-type layer 35 and evaporation of a titanium layer and an aluminium layer, in this order, into said areas. In other selected areas of the substrate, electrical contacts are made to the p-type layer 37 light-emitting diode heterostructure by etching from the growth surface to expose this p-type layer 37 and evaporation of a nickel layer and a gold layer, in this order, into said areas.

The light-emitting diode is arranged to illuminate the quantum dots formed by the islands 49. When a forward electrical bias is applied between the n-type layer 35 and the p-type layer 37, photons are emitted from the active region 36 of the light emitting diode. As these photons pass through the wetting layer 17 and quantum dots, some or all of the photons are absorbed, resulting in electrons and holes being introduced into the quantum dots. A photon may be absorbed in a quantum dot so that an electron and a hole are created in the quantum dot and the electron and hole then relax to the lowest unoccupied energy states within the quantum dot. Alternatively, a photon may be absorbed in the wetting layer 17 so that an electron and a hole are created in the wetting layer and the electron and hole may then diffuse into a quantum dot and relax to the lowest unoccupied energy states within the quantum dot. After an electron and a hole have relaxed to the lowest unoccupied energy states within a quantum dot the electron and hole recombine with each other and a photon is emitted. The energy of photons emitted from the quantum dots is smaller than the energy of the photons emitted from the active region 36 of the light emitting diode. The energy of photons emitted from the quantum dots depends on the properties of the quantum dots, such as their size, shape and composition. Therefore, since these properties of the quantum dots depend on the PPD used for different regions of the substrate, the overall emission spectrum from each region of the device depends on the choice of PPD in that region.

By distributing different PPDs across the surface of the growth substrate, the peak wavelength and the emission spectrum from each region can be varied. Therefore, by appropriate selection of the distribution of PPD across the surface of the substrate, when the substrate is divided to yield individual chips, each chip contains at least two regions with different overall emission spectra.

Although FIG. 7 shows the active region 36 disposed between the substrate 12 and the quantum dots, the active region could in principle be disposed on the opposite side of the substrate 12 to the quantum dots.

The PPDs of the embodiment of FIG. 7 may for example be arranged in any one of the ways described with reference to FIGS. 4a to 4c, 5a and 5b and 6a to 6b above.

The invention has been described above with particular reference to light-emitting devices. The invention is not however limited to light-emitting devices, and may in principle be applied to any device that uses quantum dots and where the provision, in a single layer, of quantum dots having different properties is desired.

For example, the invention may alternatively be applied to a light-sensitive semiconductor device, such as a photodiode. The invention may provide a light-sensitive semiconductor device in which the quantum dots over one or more regions have different light-absorbing properties from the quantum dots over one or more other regions.

As a further example, the invention may alternatively be applied to a semiconductor memory device in which carriers are stored in quantum dots. The invention may provide a semiconductor memory device in which quantum dots over one or more regions have different carrier storing properties from the quantum dots over one or more other regions.

The present invention is not limited to the description of the embodiments above, but may be altered by a skilled person within the scope of the claims. An embodiment based on a proper combination of technical means disclosed in different embodiments is encompassed in the technical scope of the present invention.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A method of manufacturing a semiconductor device, the method comprising the steps of:
    treating a semiconductor surface to obtain at least one first region of the semiconductor surface having a first value of average surface lattice parameter and at least one second region of the semiconductor surface having a second value of average surface lattice parameter different from the first value;
    depositing a second semiconductor layer over the semiconductor surface to a thickness such that self-organised islands form over both the at least one first region and the at least one second region, the self-organised islands over the or each first region having a first average value of a parameter and the self-organised islands over the or each second region having a second average value of a parameter different from the first value;
    and depositing a capping layer over the second semiconductor layer whereby the self-organised islands form quantum dots, the quantum dots over the or each first region having different properties from the quantum dots over the or each second region; wherein
    treating of the semiconductor surface includes forming one or more strain-relieving structures being a plurality of pits formed on the semiconductor surface, and adjusting at least one of a depth, shape, sidewall design or distribution pattern on the semiconductor surface, of each of the plurality of pits, and
    the at least one first region and the at least one second region are incorporated onto a substrate using a single epitaxial deposition process.

2. A method as claimed in claim 1 wherein the semiconductor device is a semiconductor light-emitting device and wherein the quantum dots over the or each first region have different optical properties from the quantum dots over the or each second region.

3. A method as claimed in claim 1 wherein the semiconductor device is a light-sensitive semiconductor device and wherein the quantum dots over the or each first region have different light-absorbing properties from the quantum dots over the or each second region.

4. A method as claimed in claim 1 wherein the semiconductor device is a memory device in which carriers are stored in quantum dots, and wherein the quantum dots over the or each first region have different carrier storing properties from the quantum dots over the or each second region.

5. A method as claimed in claim 1 wherein the semiconductor surface further has at least one third region having a third value of average surface lattice parameter different from the first value and from the second value, whereby quantum dots over the or each third region have different properties from the quantum dots over the or each first region and from the quantum dots over the or each second region.

6. A method as claimed in claim 5 wherein the quantum dots over the or each first region have different optical properties from the quantum dots over the or each second region and wherein quantum dots over the or each third region have different optical properties from the quantum dots over the or each first region and from the quantum dots over the or each second region.

7. A method as claimed in claim 1 wherein the parameter is the average height, in a direction perpendicular to the plane of the semiconductor surface, of the self-organised islands.

8. A method as claimed in claim 1 wherein the parameter is the average width, in a direction parallel to the plane of the semiconductor surface, of the self-organised islands.

9. A method as claimed in claim 1 wherein the parameter is the average shape of the self-organised islands.

10. A method as claimed in claim 1 wherein the parameter is the average composition of the self-organised islands.

11. A method as claimed in claim 1 wherein the semiconductor surface is a surface of a first semiconductor layer, and comprising treating the first semiconductor layer to produce the or each first region having the first value of average surface lattice parameter.

12. A method as claimed in claim 11 and comprising treating the first semiconductor layer to produce the or each second region having the second value of average surface lattice parameter.

13. A method as claimed in claim 11 wherein the first semiconductor layer is a strained semiconductor layer.

14. A method as claimed in claim 13 wherein treating the first semiconductor layer comprises forming one or more strain-relieving structures in the second region of the semiconductor layer.

15. A method as claimed in claim 1, wherein treating the first semiconductor layer comprises forming one or more pits having a first depth in the or each first region of the first semiconductor layer and forming one or more pits having a second depth different from the first depth in the or each second region of the first semiconductor layer.

16. A method as claimed in claim 13 wherein treating the first semiconductor layer comprises forming one or more pits having a first shape, projected on the plane of the first semiconductor layer, in the or each first region of the first semiconductor layer and forming, in the or each second region of the first semiconductor layer, one or more pits having a second shape, projected on the plane of the first semiconductor layer, different from the first shape.

17. A method as claimed in claim 13 wherein treating the first semiconductor layer comprises forming one or more pits having a first sidewall design in the or each first region of the first semiconductor layer and forming one or more pits having a second sidewall design different from the first sidewall design in the or each second region of the first semiconductor layer.

18. A method as claimed in claim 13 wherein treating the first semiconductor layer comprises forming one or more pits having a first distribution pattern in the or each first region of the first semiconductor layer and forming one or more pits having a second distribution pattern different from the first distribution pattern in the or each second region of the first semiconductor layer.

19. A method as claimed in claim 1 and comprising the further step of depositing a buffer layer over the semiconductor surface before depositing the second semiconductor layer.

20. A method as claimed in claim 1 and comprising the further steps of: depositing another semiconductor layer over the capping layer to a thickness such that self-organised islands form; and depositing another capping layer over the another semiconductor layer thereby to form a second plurality of quantum dots.

21. A semiconductor device manufactured by a method as defined in claim 1 and having a first active region, a first part of the first active region containing a plurality of first quantum dots and a second part of the first active region containing a plurality of second quantum dots, the first quantum dots having different properties from the second quantum dots.

22. A device as claimed in claim 21 wherein the device is a light-emitting device and the first quantum dots have different optical properties from the second quantum dots.

23. A device as claimed in claim 21 wherein a third part of the first active region contains a plurality of third quantum dots, the third quantum dots having different properties from the first quantum dots and from the second quantum dots.

24. A device as claimed in claim 23 wherein the first quantum dots have different optical properties from the second quantum dots and wherein the third quantum dots have different optical properties from the first quantum dots and from the second quantum dots.

25. A device as claimed in claim 24 wherein the first quantum dots have a peak emission wavelength in the blue region of the spectrum, the second quantum dots have a peak emission wavelength in the green region of the spectrum, and the third quantum dots have a peak emission wavelength in the red region of the spectrum.

26. A device as claimed in claim 21 and comprising having a second active region disposed above the first active region, the second active region containing quantum dots.

27. A device as claimed in claim 26 wherein a first part of the second active region containing a plurality of fourth quantum dots and a second part of the second active region containing a plurality of fifth quantum dots, the fourth quantum dots having different properties from the fifth quantum dots.

28. A device as claimed in claim 21 and further comprising an active region for light emission, the active region for light emission arranged to illuminate, in use, the first active region.

29. A device as claimed in claim 21 wherein the semiconductor surface is an (Al,In,Ga)N surface.

30. A device as claimed in claim 21 wherein the second semiconductor layer is an (Al,In,Ga)N layer.

* * * * *